United States Patent
McMullin et al.

(10) Patent No.: US 6,331,781 B2
(45) Date of Patent: *Dec. 18, 2001

(54) SPACED ADAPTOR PLATE FOR SEMICONDUCTOR TESTER

(75) Inventors: Jeffrey S. McMullin; James M. Hannan, both of Portland, OR (US)

(73) Assignee: Credence Systems Corporation, Fremont, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/428,684

(22) Filed: Oct. 27, 1999

(51) Int. Cl.[7] .................................................. G01R 31/02
(52) U.S. Cl. ........................ 324/754; 324/760; 324/758; 324/757; 324/158.1
(58) Field of Search .................................. 324/757, 754, 324/760, 755, 158.1, 758

(56) References Cited

U.S. PATENT DOCUMENTS

| | | | |
|---|---|---|---|
| 4,308,498 | * 12/1981 | Madajewski et al. | 324/757 |
| 4,677,375 | * 6/1987 | Nakaie et al. | 324/757 |
| 4,870,354 | * 9/1989 | Davaut | 324/757 |
| 5,654,631 | * 8/1997 | Ames | 324/158.1 |
| 5,742,168 | * 4/1998 | Kiyokawa et al. | 324/754 |
| 5,844,420 | * 12/1998 | Weber et al. | 324/757 |
| 5,942,907 | * 8/1999 | Chiang | 324/762 |
| 6,072,323 | * 6/2000 | Hembree et al. | 324/755 |
| 6,078,387 | * 11/1998 | Sykes | 356/244 |
| 6,104,204 | * 8/2000 | Hayama et al. | 324/760 |

OTHER PUBLICATIONS

The IEEE Standard Dictionary of Electrical and Electronics Terms. 1996, sixth edition.*

* cited by examiner

*Primary Examiner*—Glenn W. Brown
*Assistant Examiner*—Wasseem H. Hamdan
(74) *Attorney, Agent, or Firm*—John Smith-Hill; Smith-Hill and Bedell

(57) ABSTRACT

A load board is attached to the test head of a semiconductor tester and has a receptacle surface oriented substantially perpendicular to a Z-axis and presented toward a handler location. An adaptor plate is attached to a Z axis abutment structure and has a surface at a predetermined Z axis position relative to the receptacle surface of the load board, the surface of the adaptor plate being presented toward the handler location. At least three spacers are attached to the adaptor plate and project from the surface of the adaptor plate.

10 Claims, 2 Drawing Sheets

SPACED ADAPTOR PLATE FOR SEMICONDUCTOR TESTER

BACKGROUND OF THE INVENTION

This invention relates to an adaptor plate for a semiconductor tester.

A semiconductor tester typically includes a test head and pin electronics circuits mounted in the test head. A load board is attached to the test head and provides part of an electrical interface between terminals of a device under test (DUT). A semiconductor tester can be used in conjunction with a device handler for testing packaged devices. In this case, the test head is typically positioned beneath the handler with the load board in a horizontal plane and the test head is moved in a horizontal (XY) plane to position a receptacle attached to the load board vertically below a socket attached to the handler. The test head is then moved vertically upwards (along the Z axis) to engage the receptacle with the socket. When the socket and receptacle are properly engaged, the handler delivers devices to be tested to the socket, and the socket and receptacle provide an electrical interface between the DUT and the pin electronics circuits.

In order to avoid damage due to collision between the socket and receptacle, upward vertical movement of the test head relative to the handler must be positively limited. Hitherto, in order to provide a positive stop for limiting upward movement of the test head relative to the handler, the test head has been provided with an adaptor plate that is disposed horizontally and is formed with an opening through which the load board is exposed. The adaptor plate is secured to the test head and rests against a Z axis abutment or shoulder at a predetermined position relative to the upper surface of the load board. The thickness of the adaptor plate is selected so that when the test head is in the proper vertical position relative to the handler, the upper surface of the adapter plate is in contact with the bottom of the handler.

Frequently, a given tester is designed so that it can be used in conjunction with several different handlers. From handler to handler, the vertical position of the socket relative to the bottom of the handler can vary. Further, the dimensions of the socket and receptacle depend on the particular device being tested, and so the height of the socket and receptacle when engaged can vary from device to device. Consequently, the height of the upper surface of the load board relative to the bottom of the handler can vary from handler to handler and from device to device. This has hitherto necessitated that potentially a different adaptor plate is needed for each combination of handler and device. The adaptor plates are bulky and are expensive to manufacture and furthermore it is time consuming and inconvenient to have to change the adaptor plate each time the tester is used with a different handler or for testing a different device.

SUMMARY OF THE INVENTION

In accordance with a first aspect of the invention there is provided a semiconductor test apparatus including a tester having a test head, a load board attached to the test head and having a receptacle surface oriented substantially perpendicular to a Z-axis and presented toward a handler location, a Z axis abutment structure, an adaptor plate attached to the Z axis abutment structure and having a surface at a predetermined Z axis position relative to the receptacle surface of the load board, the surface of the adaptor plate being presented toward the handler location, and a set of at least three spacers attached to the adaptor plate and projecting from the surface of the adaptor plate.

In accordance with a second aspect of the invention there is provided a semiconductor test apparatus including a tester having a test head, a device handler, a load board attached to the test head and having a receptacle surface oriented substantially perpendicular to a Z axis and presented toward the handler, a Z axis abutment structure, an adaptor plate attached to the Z axis abutment structure and having a surface at a predetermined Z axis position relative to the receptacle surface of the load board, the surface of the adaptor plate being presented toward the handler, and a set of at least three spacers interposed between the adaptor plate and the handler.

BRIEF DESCRIPTION OF THE DRAWINGS

For a better understanding of the invention, and to show how the same may be carried into effect, reference will now be made, by way of example, to the accompanying drawings, in which.

DETAILED DESCRIPTION

Figure 1:
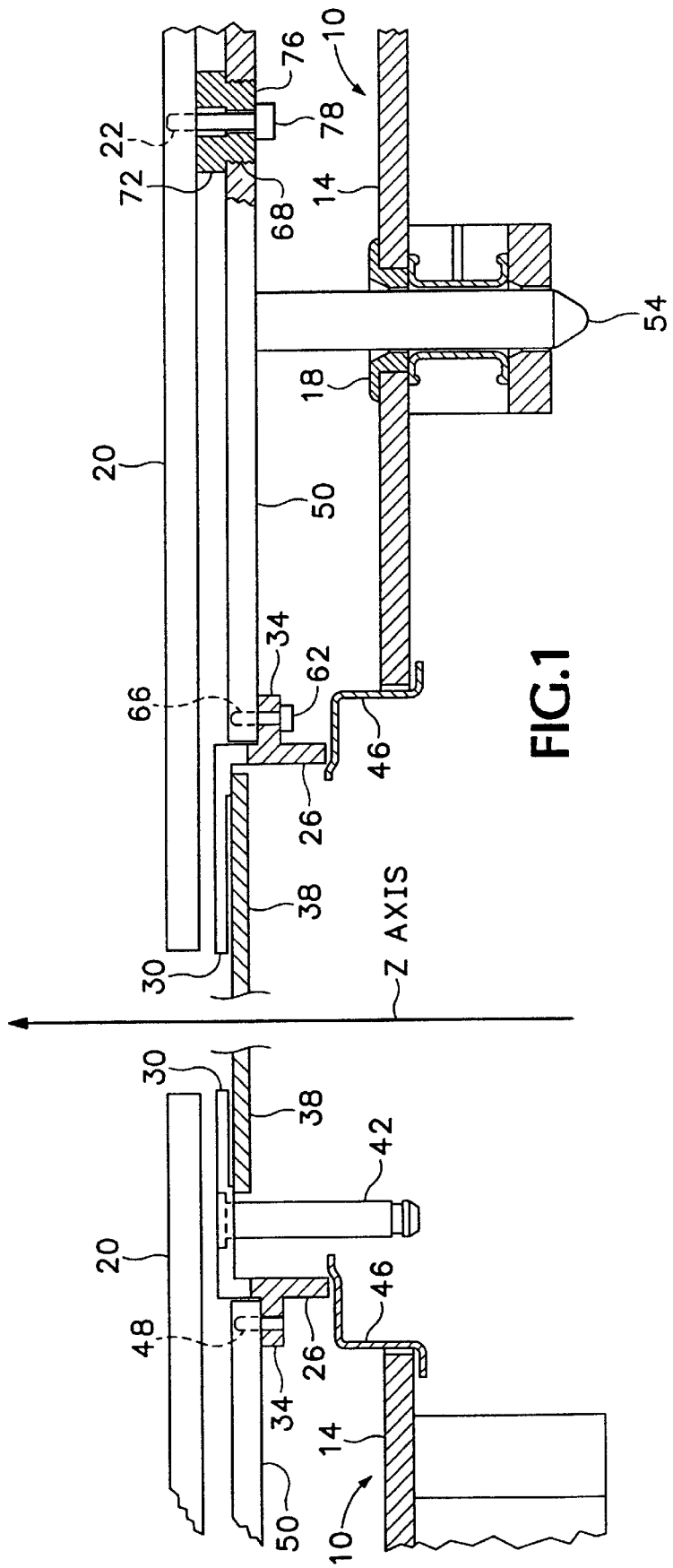
FIG. 1A is a sectional view illustrating one part of a tester and a device handler and FIG. 1B is a similar view illustrating another part of the tester and the device handler, FIGS. 1A and 1B being referred to herein collectively as FIG. 1.

The illustrated tester includes a test head 10 which is shown only partially in FIG. 1. The test head includes a structural frame (not shown) to which other components of the test head are attached. At its upper surface, the test head has an annular positioning plate 14 which is attached to the structural frame and accommodates three gross alignment sockets 18, only one of which is shown in FIG. 1.

Inward of the positioning plate 14 is a clamp ring 26 having an internal flange 30 and an external flange 34. A load board 38 is attached to the internal flange 30 of the clamp ring by two screws (not shown) or another suitable mechanism. The internal flange of the clamp ring leaves a central area of the upper surface of the load board free to receive a receptacle (not shown) for engagement with a handler socket. Because the upper surface of the load board engages the internal flange of the clamp ring, the vertical position of the upper surface of the load board is fixed relative to the upper surface of the external flange.

The clamp ring is provided with two gripper pins 42 (only one of which is shown in FIG. 1) for engaging a retaining mechanism (not shown) attached to the frame of the test head. When the gripper pins 42 engage the retaining mechanism, the retaining mechanism draws the clamp ring downwards, as seen in FIG. 1, bringing conductor pads on the underside of the load board into electrically conductive pressure contact with pogo pins that are mounted in the test head and are connected to the pin electronics circuits. The load board is replaceable by disengaging the gripper pins from the retaining mechanism and removing the clamp ring from the test head, and unscrewing the load board from the clamp ring. A shroud plate 46 limits penetration of dust and contaminants into the interior of the test head.

Figure 2:
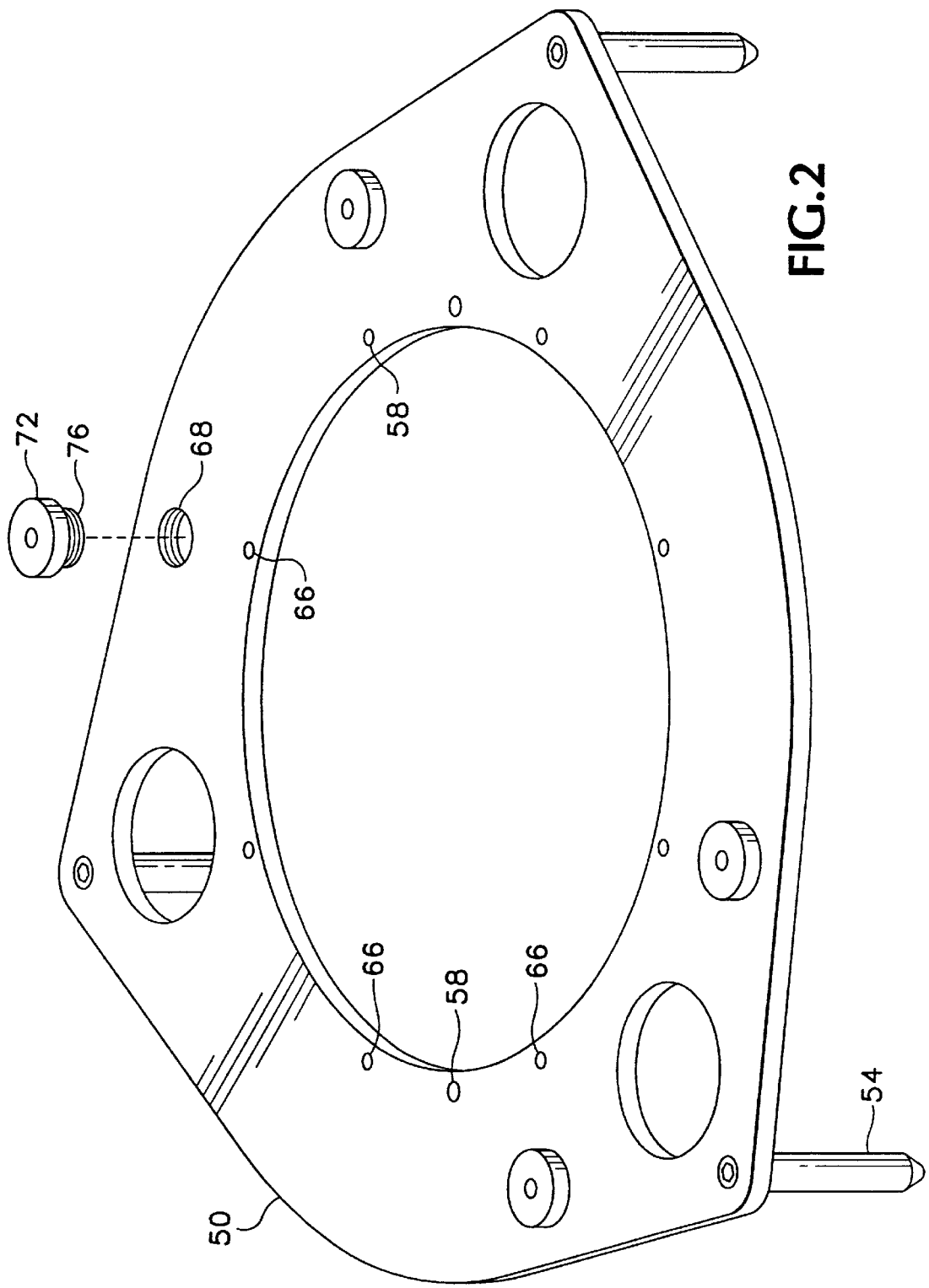
FIG. 2 is a perspective view of a universal adaptor plate, which is shown in section in FIG. 1.

Referring now to both FIG. 1 and FIG. 2, a universal adaptor plate 50 which is of generally convex triangular form is provided with a gross alignment pin 54 at each corner. The gross alignment pins 54 fit in the gross alignment sockets 18 of the test head for gross XY positioning of the adaptor plate 50 relative to the test head.

Two alignment pins 48 (only one of which is shown in FIG. 1) are secured to the clamp ring and project upward from the external flange 34. The adaptor plate is formed with two alignment bores 58. When the gross alignment pins are fitted in the gross alignment sockets, the adaptor plate is positioned relative to the frame with sufficient precision for engagement of the alignment pins 48 in the alignment bores 58. Engagement of the alignment pins 48 in the bores 58 brings the adaptor plate to a precisely determined XY position relative to the clamp ring. The adaptor plate is secured to the clamp ring by screws 62 fitted through holes in the external flange and engaging holes 66 in the adaptor plate. The external flange 34 of the clamp ring 26 serves as a Z axis abutment structure for the adaptor plate 50. When the adaptor plate 50 engages the external flange 34 of the clamp ring, the upper surface of the adaptor plate is placed in a precisely determined Z-axis position relative to the upper surface of the load board.

The handler includes a horizontally disposed handler plate 20. The handler plate is formed with four threaded holes 22, only one of which is shown in FIG. 1, at the corners of a 400 mm×200 mm rectangle. The handler socket lies within that rectangle.

The thickness of the adaptor plate is selected such that for any handler with which the tester operates, and for any socket/receptacle combination, when the test head is at the proper height for engagement of the socket and receptacle, there is a space of at least about 2.5 mm between the upper surface of the adaptor plate and the lower surface of the handler plate.

The adaptor plate is formed with internally threaded holes 68 lying on the corners of a 400 mm×200 mm rectangle. The load board receptacle is located within that rectangle. Four spacer discs 72, each having a threaded boss 76, are threaded in the holes 68 in the adaptor plate. The spacer discs are knurled to facilitate hand tightening of the boss in the hole. Each spacer disc is provided with a captive screw 78 which is fitted in the spacer disc so that its threaded portion extends to the opposite side of the disc from the threaded boss. The threaded portions of the captive screws 78 are sized for threadedly engaging the holes 22 in the handler plate.

When the adaptor plate is properly engaged with the alignment pins 48 and the test head is positioned beneath the handler plate so that the receptacle is vertically below the socket, the captive screws 78 are respectively aligned with the holes 22 in the handler plate. The test head is raised until the spacer discs 72 engage the handler plate 20. The load board is then positioned at the proper height relative to the handler plate for reliable engagement of the load board receptacle with the handler socket, but engagement of the spacer discs with the handler plate prevents collision damage. The screws 78 are threaded into the holes 22 of the handler plate and are tightened to secure the test head to the handler.

The axial thickness of the spacer disc establishes the height at which the test head engages a positive stop against the handler.

There is a different set of spacer discs for each different value of the spacing of the upper surface of the adaptor plate from the lower surface of the handler plate. When changing the test head to a different handler, or to a different socket/receptacle combination, the operator selects the proper set of spacer discs and attaches these spacer discs to the adaptor plate.

In use of the test head equipped with the universal adaptor plate and the proper set of spacer discs, the test head encounters a positive stop limiting upward movement toward the handler at the proper height relative to the handler without its being necessary to remove and replace the adaptor plate. It is much simpler and more convenient to remove and replace the spacer discs because the proper position of a spacer disc is determined by engagement of its threaded boss in the appropriate hole 68, rather than its being necessary to align the three gross alignment pins 54 with respective sockets 18 and engage the two alignment pins 48. Further, a set of spacer discs is much less bulky and is cheaper to manufacture than an adaptor plate.

In another application of the invention, the adaptor plate is not attached to the test head prior to positioning of the test head below the handler. In this case, the adaptor plate is attached to the handler plate using the four captive screws 78. The clamp ring 26, having the load board 38 attached thereto, is positioned so that the alignment pins 48 engage the alignment bores 58 and the external flange 34 engages the lower surface of the adaptor plate. The clamp ring is then attached to the adaptor plate by the screws 62 threaded through the holes in the external flange and entering threaded engagement with the adaptor plate. The test head is then positioned beneath the adaptor plate such that the gross alignment sockets 18 are aligned with the gross alignment pins 54 and the test head is raised until the gripper pins 42 engage the retaining mechanism in the test head and the retaining mechanism secures the test head to the clamp ring. In this case also, cooperation of the spacer discs with the adaptor plate and the handler plate ensures that the load board is positioned at the proper height relative to the handler plate.

It will be appreciated that the invention is not restricted to the particular embodiment that has been described, and that variations may be made therein without departing from the scope of the invention as defined in the appended claims and equivalents thereof. For example, although the invention has been described with reference to an arrangement in which the test head is positioned beneath the handler with the load board in a horizontal plane and the test head is moved vertically upwards (along the Z axis) to engage the receptacle with the socket, those skilled in the art will understand that other arrangements are possible. In particular, it is common for the test head to be positioned with the load board in a vertical orientation and for the test head to be moved horizontally to engage the receptacle with the socket. Accordingly, the invention is not restricted to the type of arrangement that has been described with reference to the drawings and is applicable to other arrangements also. It will also be appreciated that although the invention has been described in the context of the adaptor plate being associated with a given test head and the spacer discs being changed to accommodate use of the given test head with a different handler or for testing a different device, a user may find it more convenient to associate the adaptor plate with a given handler and to change the spacer discs to accommodate use of the given handler with a different test head or for testing a different device.

What is claimed is:

1. A semiconductor test apparatus including a tester having a test head, a load board attached to the test head and having a receptacle surface oriented substantially perpendicular to a Z-axis and presented toward a handler location, a Z axis abutment structure, an adaptor plate attached to the Z axis abutment structure and having a surface at a predetermined Z axis position relative to the receptacle surface of the load board, the Z-axis position being determined by the Z-axis abutment structure, the surface of the adaptor plate being presented toward the handler location, and a set of at least three spacers attached to the adaptor plate and projecting from the surface of the adaptor plate.

2. Apparatus according to claim 1, wherein each spacer includes an attachment boss and the adaptor plate is formed with holes for receiving the attachment bosses respectively.

3. Apparatus according to claim 2, wherein each attachment boss includes a captive screw for engaging a device handler at the handler location.

4. A semiconductor test apparatus including a tester having a test head, a device handler, a load board attached to the test head and having a receptacle surface oriented substantially perpendicular to a Z axis and presented toward the handler, a Z axis abutment structure, an adaptor plate attached to the Z axis abutment structure and having a surface at a predetermined Z axis position relative to the receptacle surface of the load board, the Z-axis position being determined by the Z-axis abutment structure, the surface of the adaptor plate being presented toward the handler, and a set of at least three spacers interposed between the adaptor plate and the handler.

5. Apparatus according to claim 4, wherein the spacers are attached to the handler.

6. Apparatus according to claim 5, wherein each spacer includes an attachment boss and the adaptor plate is formed with holes for receiving the attachment bosses respectively.

7. Apparatus according to claim 4, wherein the spacers are attached to the adaptor plate.

8. Apparatus according to claim 7, wherein each spacer includes an attachment boss and the handler is formed with holes for receiving the attachment bosses respectively.

9. Apparatus according to claim 4, wherein the adaptor plate is attached to both the test head and the handler.

10. Apparatus according to claim 6, wherein each spacer includes an attachment boss and the adaptor plate is formed with holes for receiving the attachment bosses respectively.

* * * * *

UNITED STATES PATENT AND TRADEMARK OFFICE
CERTIFICATE OF CORRECTION

PATENT NO. : 6,331,781 B1
DATED : December 18, 2001
INVENTOR(S) : Jeffrey S. McMullin and James M. Hannan It is certified that error appears in the above-identified patent and that said Letters Patent is hereby corrected as shown below:

<u>Column 6,</u>
Line 15, "6" should be deleted and replaced with -- 9 --.

Signed and Sealed this

Fourteenth Day of May, 2002

*Attest:*

*Attesting Officer*

JAMES E. ROGAN
*Director of the United States Patent and Trademark Office*